United States Patent
Kizilyalli et al.

(10) Patent No.: US 6,365,511 B1
(45) Date of Patent: Apr. 2, 2002

(54) TUNGSTEN SILICIDE NITRIDE AS A BARRIER FOR HIGH TEMPERATURE ANNEALS TO IMPROVE HOT CARRIER RELIABILITY

(75) Inventors: Isik C. Kizilyalli; Sailesh M. Merchant; Joseph R. Radosevich, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/324,946

(22) Filed: Jun. 3, 1999

(51) Int. Cl.⁷ .......................................... H01L 21/4763
(52) U.S. Cl. ...................... 438/649; 438/627; 438/643; 438/683; 438/655
(58) Field of Search ................. 438/649, 627–630, 438/637–640, 643–644, 653–656, 683, 685, 687–688, 672, 592

(56) References Cited

U.S. PATENT DOCUMENTS

| | | |
|---|---|---|
| 3,903,325 A | 9/1975 | Horiuchi |
| 4,268,321 A | 5/1981 | Meguro |
| 4,268,951 A | 5/1981 | Elliott et al. |
| 4,620,211 A | 10/1986 | Baliga et al. |
| 4,851,370 A | 7/1989 | Doklan et al. |

(List continued on next page.)

FOREIGN PATENT DOCUMENTS

| | | |
|---|---|---|
| JP | 61-264350 | 11/1986 |
| JP | 64-41211 | 2/1989 |
| JP | 1-211970 | 8/1989 |
| JP | 2-277269 | 11/1990 |
| JP | 03-222321 | 10/1991 |

(List continued on next page.)

OTHER PUBLICATIONS

S. Sugiyama, J. Yang and S. Guha; "Improved Stability Against Light Exposure in Amorphous Deuterated Silicon Alloy Solar Cell"; Appl. Phys. Lett. 70 (3), Jan. 20, 1997; pp. 378–380.

G. Ganguly, A. Suzuki, S. Yamasaki, K. Nomoto and A. Matsuda; "Reduced Light–Induced Changes of Photoconductivity in Duterated Amorphous Silicon"; J. Appl. Phys. 68 (7), Oct. 1, 1990; pp. 3738–3740.

N.M. Johnson, D.K. Biegelsen and M.D. Moyer; "Deuterium Passivation of Grain–Boundary Dangling Bonds in Silicon Thin Films"; Appl. Phys. Lett. 40(10), May 15, 1982; pp. 882–884.

(List continued on next page.)

*Primary Examiner*—Charles Bowers
*Assistant Examiner*—Thanh Nguyen

(57) ABSTRACT

The present invention provides a method of forming a metal stack structure over a substrate of a semiconductor device, comprising: (a) forming a first metal layer over the substrate, (b) forming a tungsten silicide nitride layer over the first metal layer, (c) forming a second metal layer over the tungsten silicide nitride layer, and (d) annealing the metal stack structure at a diffusion temperature. The tungsten silicide nitride layer inhibits diffusion of the metal in the metal stack. In one embodiment, the annealing is performed in the presence of a forming gas mixture comprising deuterium. In one particularly advantageous embodiment, the metal stack is formed in a contact opening or via. In yet other embodiments, the first metal layer may be a stack layer of titanium and titanium nitride and the second metal layer may be aluminum or copper.

13 Claims, 3 Drawing Sheets

U.S. PATENT DOCUMENTS

| | | | |
|---|---|---|---|
| 5,248,348 A | | 9/1993 | Miyachi et al. |
| 5,304,830 A | | 4/1994 | Sato |
| 5,352,636 A | | 10/1994 | Beinglass |
| 5,378,541 A | | 1/1995 | Ihara et al. |
| 5,595,927 A | | 1/1997 | Chen et al. |
| 5,614,437 A | * | 3/1997 | Choudhury ............... 438/653 |
| 5,642,014 A | | 6/1997 | Hillenius |
| 5,646,050 A | | 7/1997 | Li et al. |
| 5,668,411 A | * | 9/1997 | Hong et al. ................ 257/751 |
| 5,696,017 A | * | 12/1997 | Ueno ......................... 438/253 |
| 5,744,202 A | | 4/1998 | Nickel |
| 5,776,831 A | | 7/1998 | Padmanabhan et al. |
| 5,801,098 A | * | 9/1998 | Fiordalice et al. .......... 438/653 |
| 5,830,575 A | | 11/1998 | Warren et al. |
| 5,872,387 A | | 2/1999 | Lyding et al. |
| 5,895,267 A | * | 4/1999 | Zhao et al. ................. 438/627 |
| 5,990,008 A | * | 11/1999 | Koyama et al. ............ 438/687 |
| 6,153,519 A | * | 11/2000 | Jain et al. ................... 438/681 |
| 6,181,012 B1 | * | 1/2001 | Edelstein et al. ........... 257/762 |

FOREIGN PATENT DOCUMENTS

| | | | | |
|---|---|---|---|---|
| JP | 4-29312 | | 1/1992 | |
| JP | 4-342121 | | 11/1992 | |
| JP | 407161659 | * | 6/1995 | ............ H01I/21/28 |
| JP | 4342122 | | 11/1999 | |
| WO | 94/19829 | | 9/1994 | |

OTHER PUBLICATIONS

Yasutake Toyoshima, Akihisa Matsuda and Kazuo Arai; "In–Situ Investigation of the Growing a–Si :D Surface by Infrared Reflection Absorption Spectroscopy"; Journal of Non–Crystalline Solids 164–166 (1993); pp. 103–106.

Shigenobu Hayashi, Kikuko Hayamizu, Satoshi Mashima, Atsushi Suzuki, Peter J. Mcelheny, Satoshi Yamasaki and Akihisa Matsuda; "2D and 1H Nuclear Magnetic Resonance Study of Deuterated Amorphous Silicon and Partially Deuterated Hydrogenated Amorphous Silicon"; Japanese Journal of Applied Physics, vol. 30, No. 9A; Sep. 1991, pp. 1909–1914.

I.C. Kizilyalli, J.W. Lyding and K. Hess; "Deuterium Post–Metal Annealing of MOSFET's for Improved Hot Carrier Reliability"; IEEE Electron Device Letters, vol. 18, No. 3, Mar. 1997; pp. 81–83.

Jerzy Kanicki; "Amorphous and Microcrystalline Semiconductor Devices: Optoelectronic Devices"; (1991) pp. 13–21.

J.W. Lyding, K. Hess and Isik C. Kizilyalli; "Reduction of Hot Electron Degradation in Metal Oxide Semiconductor Transistors by Deuterium Processing"; Appl. Phys. Lett. 68 (18), Apr. 29, 1996; pp. 2526–2528.

Mehrdad M. Moslehi and Krishna C. Saraswat; "Formation of MOS Gates by Rapid Thermal/Microwave Remote–Plasma Multiprocessing"; IEEE Electron Device Letters, vol. EDL–8, No. 9, Sep. 1987; pp. 421–424.

Isik C. Kizilyalli and Jeff D. Bude; "Degradation of Gain in Bipolar Transistors"; IEEE Transaction of Electron Devices, vol. 41, No. 7, Jul. 1994, pp. 1083–1091.

Saks et al., The Time–Dependence of Post–Irradiation Interface Trap Build–Up in Deuterium–Annealed Oxides, IEEE Transactions on Nuclear Science, vol. 39, No. 6, pp. 2220–2229.

Ohji et al., Effects of Minutes Impurities (H, OH, F) on SiO/sub2//Si Interface as Investigated by Nuclear Resonant Reaction and Electron Spin Resonance; IEEE Transactions on Electron Devices, vol. 37, No. 7, pp. 1635–1642.

Kjell O. Jeppson and Christer M. Svensson; "Negative Bias Stress of MOS Devices at High Electric Fields and Degradation of NMOS Devices"; Journal of Applied Physics, vol. 48, No. 5, May 1997; pp. 2004–2014.

S. M. Sze; "Physics of Semiconductor Devices", A Wiley–Interscience Publication; p. 850.

* cited by examiner

TUNGSTEN SILICIDE NITRIDE AS A BARRIER FOR HIGH TEMPERATURE ANNEALS TO IMPROVE HOT CARRIER RELIABILITY

TECHNICAL FIELD OF THE INVENTION

The present invention is directed, in general, to a semiconductor barrier and, more specifically, to a semiconductor barrier subjected to a high temperature deuterium anneal to improve hot carrier reliability.

BACKGROUND OF THE INVENTION

For simplicity of manufacture, a manufacturer would prefer to fill contact vias in semiconductor devices by depositing a metal layer, typically aluminum (Al) into the via and onto a patterned silicon substrate. However, during certain fabrication processes, the Al may diffuse into the silicon substrate, and vice versa. If the Al diffuses too far into the silicon substrate, an undesirable condition called junction spiking can occur. To prevent this diffusion, a barrier layer of titanium nitride (TiN) is deposited over the silicon substrate and before the Al is deposited. However, TiN does not adhere well to the silicon substrate. In contrast, titanium (Ti) adheres well to both the silicon substrate and TiN. Therefore, an adhesion layer of titanium (Ti) is first deposited on the silicon substrate, followed by a barrier layer of TiN.

After the Al is deposited, the metal stack is subjected to a low temperature metallization boost anneal at about 400° C. to 425° C. for between ½ and 2 hours. This annealing is typically carried out in a forming gas mixture of nitrogen ($N_2$) and a low concentration of hydrogen ($H_2$). Unfortunately, TiN begins to break down between about 425° C.–450° C. If the anneal is prolonged or performed at a temperature over about 425° C., the TiN barrier breakdown allows Ti to diffuse through the TiN layer and into the Al layer. This results in a large increase in the metal stack sheet resistance and via resistance. Also, there is an increased likelihood of junction leakage and, in the worst case, results in junction spiking.

It has been discovered that if sub-0.5 micron devices, e.g., CMOS, FLASH, bipolar, analog, are annealed in a forming mixture of deuterium ($D_2$) instead of $H_2$, hot carrier reliability results in a 100 times improvement. However, for annealing with a $D_2$ mixture to be effective, process temperatures should be above 400° C. Therefore, the process temperatures for $D_2$ annealing and the effective use of a TiN barrier are in direct conflict.

Accordingly, what is needed in the art is a barrier material suitable for use in high-temperature $D_2$ anneals conducted to improve hot carrier reliability.

SUMMARY OF THE INVENTION

To address the above-discussed deficiencies of the prior art, the present invention provides a method of forming a metal stack structure over a substrate of a semiconductor device, comprising: (a) forming a first metal layer over the substrate, (b) forming a tungsten silicide nitride layer over the first metal layer, (c) forming a second metal layer over the tungsten silicide nitride layer, and (d) annealing the metal stack structure at a diffusion temperature. The tungsten silicide nitride layer inhibits diffusion of the metal in the metal stack. While this particular embodiment is directed to the use of a tungsten silicide nitride, it should be specifically understood that the present invention may include the use of other metal silicides, such as metals selected from Groups 5 or 6 of the Periodic Table.

In one particularly advantageous embodiment, the metal stack is formed in a contact opening or via of the semiconductor device. The first metal layer may be a stack layer of titanium and titanium nitride and the second metal layer may be aluminum. Alternatively, the stack layer may be tantalum and tantalum nitride and the second metal layer may be copper. However, other combinations of metal stacks and metals known to those skilled in the art may also be used.

In another aspect of the present invention, forming the tungsten silicide nitride layer includes forming the tungsten silicide nitride layer over a titanium nitride layer. In certain embodiments, the annealing time may be greater than about one-half hour and the annealing may be conducted at a temperature greater than about 400° C., and if desired, the annealing may be performed in the presence of a forming gas mixture comprising deuterium.

In an alternative embodiment, a titanium silicide layer may be formed over the substrate. However, the tungsten silicide nitride layer may also include forming the tungsten silicide nitride layer over the titanium silicide layer.

In one aspect of the present invention, the semiconductor device may be a CMOS device, a BiCMOS device, a FLASH device, an analog device, or a Bipolar device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
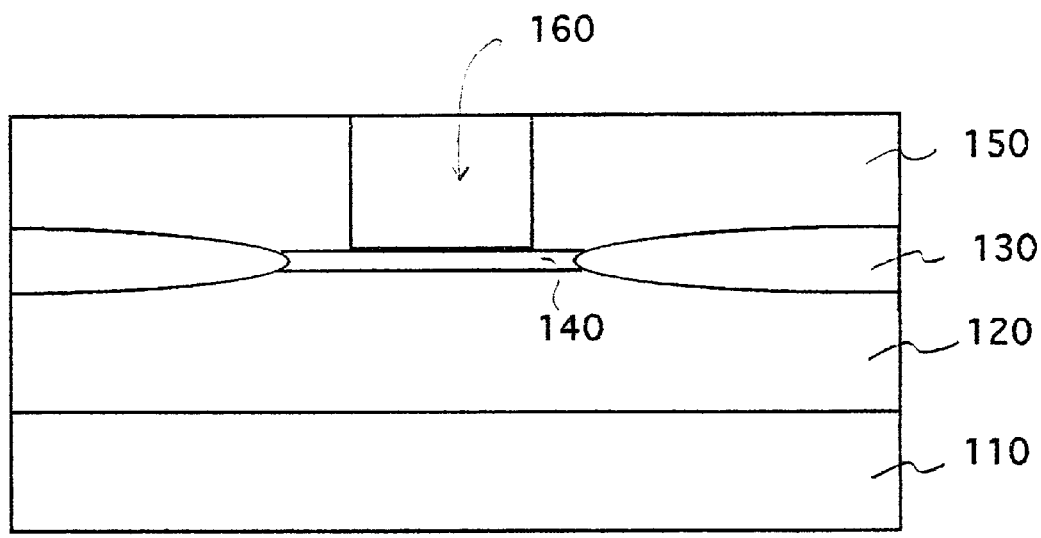
FIG. 1 illustrates a sectional view of one embodiment of a semiconductor device at an intermediate stage of manufacture constructed according to the principles of the present invention.

Referring initially to FIG. 1 illustrated is a sectional view of one embodiment of a semiconductor device at an intermediate stage of manufacture constructed according to the principles of the present invention. A semiconductor device, generally designated 100, comprises a silicon substrate 110, a tub region 120, field oxide regions 130, a gate oxide 140, and a dielectric layer 150. A contact opening 160 in the dielectric layer 150 has been formed at this stage of manufacture to provide interconnect access to the gate oxide 140. The contact opening 160 may also be a via formed in a subsequent dielectric layer. One who is skilled in the art is familiar with the conventional processes used to form the semiconductor device 100 at this stage of manufacture.

Figure 2:
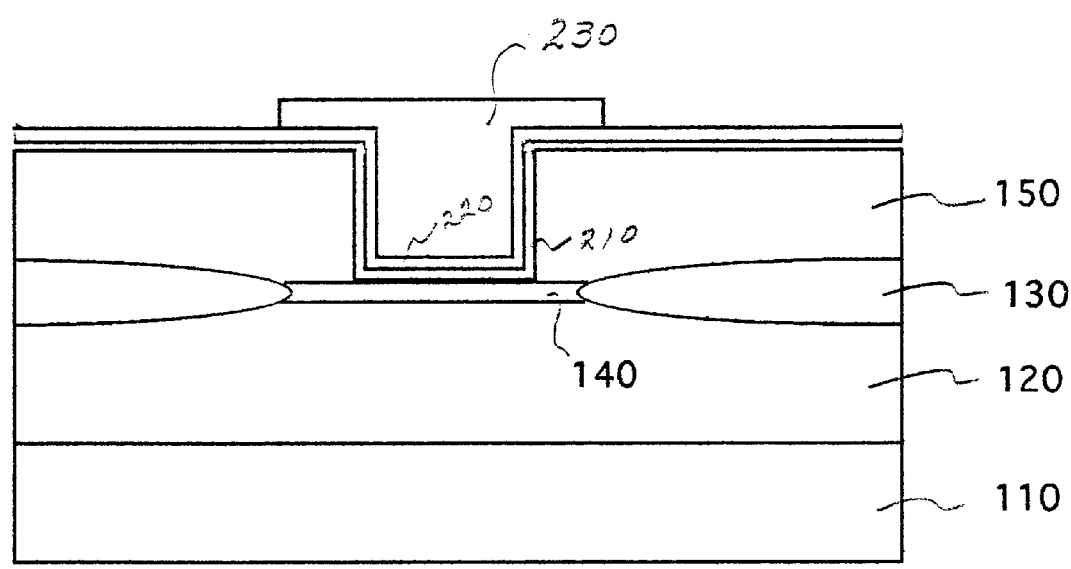
FIG. 2 illustrates a sectional view of the semiconductor device of FIG. 1 at a subsequent stage of manufacture.

Referring now to FIG. 2, illustrated is a sectional view of the semiconductor device of FIG. 1 at a subsequent stage of manufacture. A first metal layer 210, such as titanium (Ti) or tantalum (Ta), a tungsten silicide nitride ($WSi_xN_y$) layer 220, and a second metal layer 230 have been deposited by conventional processes. The presence of the tungsten silicide nitride is particularly advantageous because it allows the use of a high temperature anneal in the presence of deuterium to substantially enhance or improve the hot carrier reliability, as explained below. This is a distinct improvement over the prior art titanium/titanium nitride layers, which are not capable of withstanding high temperature anneals. The first metal layer 210 provides the necessary adhesion between the dielectric 150 and the subsequent tungsten silicide nitride layer 220. In one embodiment, the first metal layer 210 may comprise a stack layer of titanium and titanium nitride or a stack layer of tantalum and tantalum nitride.

In alternative embodiments, other metal silicide nitride compounds may be employed as the barrier layer in place of the tungsten silicide nitride. For example, the metal may be selected from among the Group 5 or Group 6 metals of the Periodic Table of the Elements as specified by the new convention of the International Union of Pure and Applied Chemistry (IUPAC). The second metal layer 230 forms an interconnect for other components (not shown) of the semiconductor device 100 to the gate oxide 140.

The semiconductor device 100 is subjected to a post-metallization boost anneal. The length of time for this anneal may vary, depending on the particular application. For example, the length of time may range from about ½ hour to about 2 hours. Additionally, the anneal may be performed at temperatures ranging from about 400° C. to about 450° C. and in a forming gas mixture of nitrogen ($N_2$) and a low concentration of deuterium ($D_2$) This temperature may be referred to as a diffusion temperature, i.e., the temperature at which diffusion may occur between and among the dielectric 150, the first metal layer 210, and the second metal layer 230, unless somehow inhibited or prevented. It is believed that the $D_2$ may be incorporated in the metal stack so that the anneal improves the hot carrier reliability by 100 times, while the tungsten silicide nitride layer 220 provides a thermal barrier against metal diffusion during the anneal. The tungsten silicide nitride layer 220 prevents inter-diffusion of the second metal layer 230 into the dielectric layer 150. One who is skilled in the art will recognize that the present invention may be used with equal efficacy in both p-tub and n-tub devices.

Figure 3:
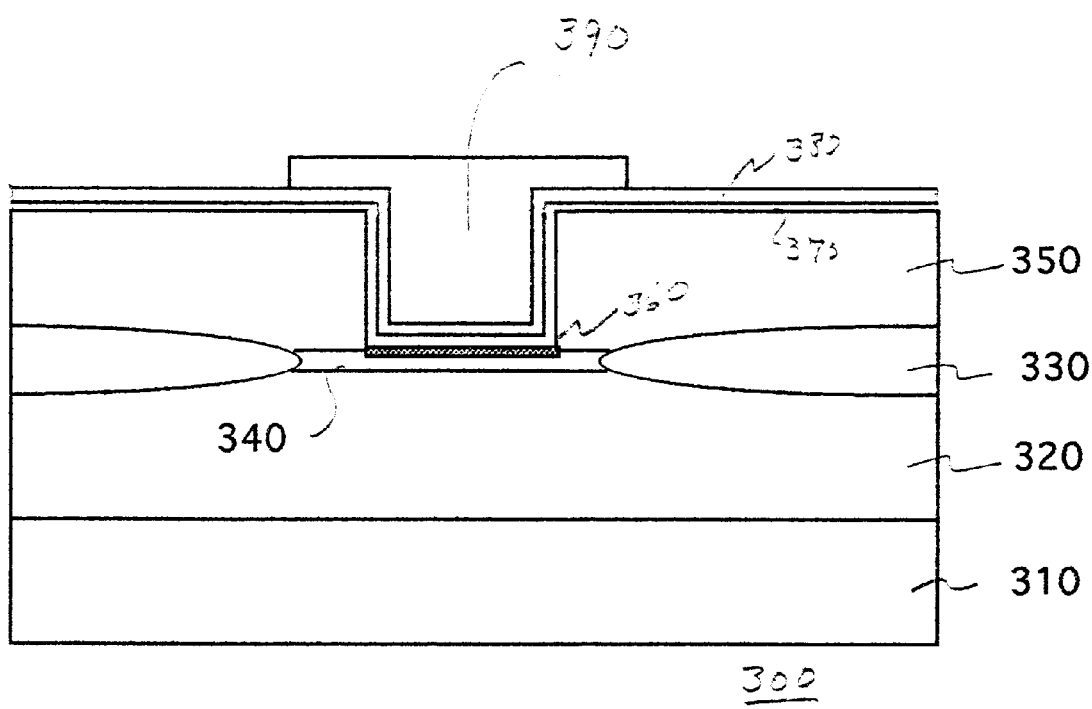
FIG. 3 illustrates an alternative embodiment of the semiconductor device of FIG. 2.

Referring now to FIG. 3, illustrated is an alternative specific embodiment of the semiconductor device of FIG. 2. In the illustrated embodiment, the semiconductor device 300 comprises a silicon substrate 310, a tub region 320, field oxide regions 330, a gate oxide 340, and a dielectric layer 350 that are analogous to the components of FIG. 2. The semiconductor device 300 further comprises a titanium silicide layer 360, a first metal layer 370, a tungsten silicide nitride layer 380, and a second metal layer 390. As in the semiconductor 100 of FIG. 2, the tungsten silicide nitride layer 380 prevents inter-diffusion of the first metal layer 370 of Ti into, the dielectric 350, and the second metal layer 390 of Al or Cu. Thus, while the tungsten silicide nitride layer 380 provides a thermal barrier for the anneal, the high temperature anneal in $D_2$ improves the hot carrier reliability by 100 times.

Figure 4:
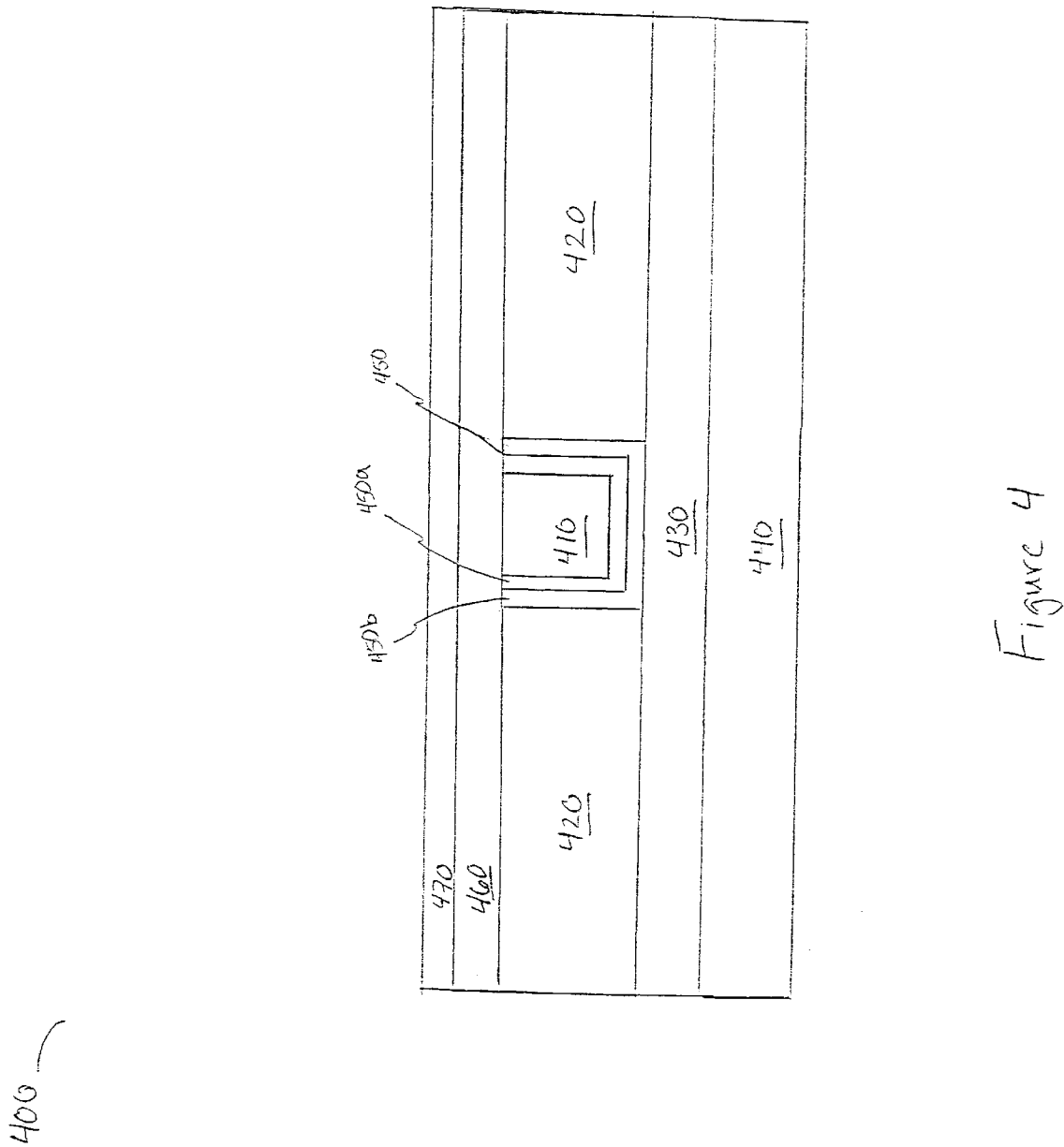
FIG. 4 illustrates an alternative embodiment of the semiconductor device of FIG. 2.

Turning now to FIG. 4 there is illustrated yet another embodiment of the present invention. In this particular embodiment, the opening is a contact plug 410 that is formed in a dielectric layer 420. The dielectric layer 420 is formed over an active device region 430 that is formed over a semiconductor wafer substrate 440. In this illustrative embodiment, a barrier layer 450, which in preferred embodiments may be a layer of titanium nitride 450a formed over a layer of titanium 450b within the contact plug opening 450. As shown, the contact plug 410 has been planarized using conventional planarization techniques to form a substantially flat, smooth surface. The adhesion layer 460 as previously discussed is formed over the contact plug 410 and the surface of the dielectric layer 420. A barrier layer 470 is formed over the adhesion layer 460. The barrier layer 470 is comprised of the same type of materials previously discussed for other embodiments. To complete the structure, an metal interconnect layer 480, such as aluminum is then formed over the barrier layer 470. Of course, those who are skilled in the art will readily recognize that other materials may be used for this embodiment as those discussed above with respect to other embodiments, e.g., tantalum-tantalum nitride/copper, etc.

One who is skilled in the art will readily envision other metal stack structures to accomplish the objectives of the present invention. For example, a stack of titanium-titanium nitride-tungsten silicide nitride-aluminum, a stack of tantalum-tantalum nitride-tungsten silicide nitride-copper, or tantalum-tungsten silicide nitride-copper are also within the scope of the present invention. One who is skilled in the art will also recognize that the principles of the present invention may be applied to devices such as: CMOS, BiCMOS, FLASH, analog, and Bipolar.

From the foregoing, it is readily apparent that the present invention provides a method of forming a metal stack structure over a substrate of a semiconductor device. The method preferably comprises forming a first metal layer over the substrate, forming a tungsten silicide nitride layer over the first metal layer, forming a second metal layer over the tungsten silicide nitride layer, and annealing the metal stack structure at a diffusion temperature. The tungsten silicide nitride layer inhibits diffusion of the metal in the metal stack and allows the use of a high temperature in a deuterium anneal, which substantially improves the hot carrier reliability of the device.

Although the present invention has been described in detail, those skilled in the art should understand that they can make various changes, substitutions and alterations herein without departing from the spirit and scope of the invention in its broadest form.

What is claimed is:

1. A method of forming a metal stack structure over a substrate of a semiconductor device, comprising:

forming a first metal layer over the substrate wherein the first metal layer includes titanium or tantalum;

forming a tungsten silicide nitride layer over the first metal layer;

forming a second metal layer over the tungsten silicide nitride layer; and annealing the metal stack structure at a diffusion temperature of at least about 450° C. and in the presence of a forming gas mixture comprising deuterium, the tungsten silicide nitride layer inhibiting a diffusion of a metal in the metal stack.

2. The method as recited in claim 1 wherein the metal stack structure is formed in a contact opening, via, or interconnect.

3. The method as recited in claim 1 wherein the first metal layer is a stack layer of titanium and titanium nitride and the second metal layer is aluminum.

4. The method as recited in claim 1 wherein the first metal layer is a stack layer of tantalum and tantalum nitride and the second metal layer is copper.

5. The method as recited in claim 1 wherein forming a tungsten silicide nitride layer includes forming the tungsten silicide nitride layer over a titanium nitride layer or a tantalum nitride layer.

6. The method as recited in claim 1 wherein forming a first metal layer includes forming a titanium silicide layer over the substrate.

7. The method as recited in claim 6 wherein forming a tungsten silicide nitride layer over the substrate includes forming the tungsten silicide nitride layer over the titanium silicide layer.

8. The method as recited in claim 1 further comprising forming a semiconductor device selected from the group:

a CMOS device, a BiCMOS device, a FLASH device;

an analog device; and a Bipolar device.

9. A method of forming a metal stack structure over a substrate of a semiconductor device, comprising:

forming a first metal layer over the substrate, wherein the first metal layer includes titanium or tantalum;

forming a metal silicide nitride layer over the first metal layer;

forming a second metal layer over the metal silicide nitride layer; and annealing the metal stack structure at a diffusion temperature of at least about 450° C. and in the presence of a forming gas mixture comprising deuterium, the metal silicide nitride layer inhibiting a diffusion of a metal in the metal stack.

10. The method as recited in claim 9 wherein the first metal layer is a stack layer of titanium and titanium nitride and the second metal layer is aluminum.

11. The method as recited in claim 9 wherein the first metal layer is a stack layer of tantalum and tantalum nitride and the second metal layer is copper.

12. The method as recited in claim 9 wherein forming the metal silicide nitride layer includes forming a tungsten silicide nitride layer.

13. The method as recited in claim 9 wherein forming the metal silicide nitride layer includes forming the metal silicide nitride layer comprising a Group 5 or Group 6 metal of the Periodic Table.

* * * * *